United States Patent [19]

Davies, Jr.

[11] 4,449,065

[45] May 15, 1984

[54] TRI-LEVEL INPUT BUFFER

[75] Inventor: Thomas J. Davies, Jr., Gilroy, Calif.

[73] Assignee: Fairchild Camera & Instrument Corp., Mountain View, Calif.

[21] Appl. No.: 308,070

[22] Filed: Oct. 2, 1981

[51] Int. Cl.³ .................... H03K 19/096; H03K 19/20
[52] U.S. Cl. ..................................... 307/473; 307/452
[58] Field of Search ............... 307/448, 451, 452, 453, 307/473, 474

[56] References Cited

U.S. PATENT DOCUMENTS

| | | | |
|---|---|---|---|
| 3,609,411 | 9/1971 | Ma et al. ............................... | 307/475 |
| 3,950,656 | 4/1976 | Sumida et al. ................... | 307/473 X |
| 3,969,633 | 7/1976 | Paluck et al. ..................... | 307/244 X |
| 4,100,429 | 7/1978 | Adachi ................................ | 307/473 |
| 4,163,907 | 8/1979 | Schroeder et al. ................. | 307/473 |
| 4,302,690 | 11/1981 | Gollinger et al. .............. | 307/473 X |
| 4,363,978 | 12/1982 | Heimbigner ..................... | 307/473 X |

OTHER PUBLICATIONS

Scarpero, Jr. "Field-Effect Transistor Bidirectional Driver Control Circuit", *IBM Tech. Discl. Bull.*, vol. 16, No. 8, pp. 2442–2443, 1/74.

Griffin et al., "High Speed Complementary Driver Circuit", *IBM Tech. Discl. Bull.*, vol. 24, No. 5, pp. 2558–2559; 10/1981.

Moraga, "A Ternary One-Trit Multiplier"; *Digital Processes* (Pub.) 2, No. 3 (Autumn) 1976, pp. 241–243.

*Primary Examiner*—Larry N. Anagnos
*Attorney, Agent, or Firm*—Kenneth Olsen; Carl L. Silverman; Ronald Craig Fish

[57] ABSTRACT

A simple six-transistor input buffer for generating and applying binary function test signals to associated circuitry in an integrated circuit package. The buffer recognizes three different voltage levels of an input signal that is applied to a single input test pin and generates three corresponding binary output signals that may be used for testing various functions of the associated circuitry.

13 Claims, 3 Drawing Figures

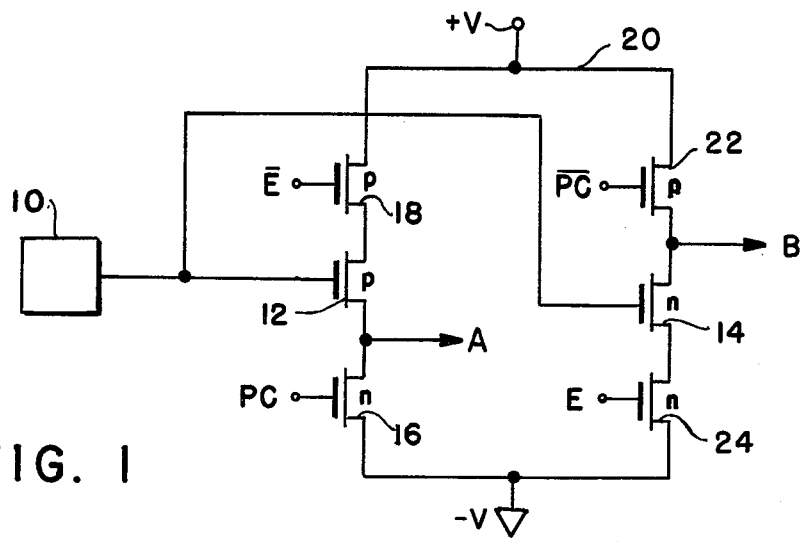
FIG. 1
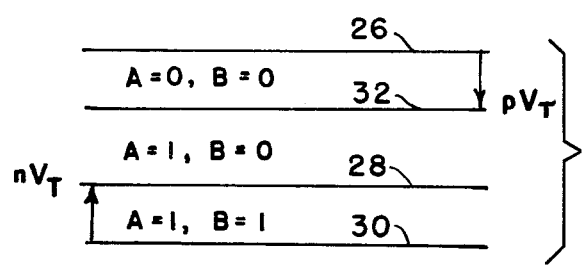
FIG. 2
| INPUT | A | B |
|-------|---|---|
| 1     | 0 | 0 |
| 1/2   | 1 | 0 |
| 0     | 1 | 1 |
FIG. 3

TRI-LEVEL INPUT BUFFER

TECHNICAL FIELD

This invention relates to electronic circuitry and in particular to a dynamic input CMOS buffer that recognizes three different input logic states.

BACKGROUND ART

Tri-level circuits are generally used in connection with various test circuitry within integrated circuit microprocessors and are seldom, if ever, used for communicating between integrated circuit chips. The advantage of such tri-level buffers is that test signals of one of three different voltage levels applied between circuit ground reference and single input test pin or pad connected to the tri-level buffer can produce one of several binary output signals for testing various functions of the associated parent circuitry.

Prior art tri-state test circuits employ a "floating input", and the circuitry tests the input to determine whether or not it is open circuited. Such tests require the circuitry to draw D.C. power from its associated parent circuitry. The tri-level input buffer to be described draws no power.

DISCLOSURE OF THE INVENTION

Briefly described, the tri-level input buffer circuit includes first and second branch circuits connected between a drain voltage source and ground reference. Each branch circuit includes a CMOS transistor pair in series with a transistor switch and an output from each branch circuit is taken from the interconnection of the p-channel field effect transistor and the n-channel transistor forming a CMOS pair. Each branch circuit is initialized by the application of a pre-charge pulse from the chip system clock followed thereafter by an evaluate pulse. If the applied input signal is at the "one" level, both branch outputs are low. If the applied input is at the low "zero" level, both outputs are high. However, if the applied input voltage level is within the threshold range of both n-channel and p-channel transistors and so that both of these transistors are conductive, one branch circuit will produce an output of "0" while the other branch will output a "1".

BRIEF DESCRIPTION OF THE FIGURES

In the drawings which illustrate the preferred embodiment of the invention:

FIG. 1 is a schematic circuit diagram of the tri-level input buffer;

FIG. 2 is a diagram illustrating binary outputs for each of the three input voltage levels; and FIG. 3 illustrates a typical truth table of input and output levels of the buffer circuit.

BEST MODE OF CARRYING OUT THE INVENTION

FIG. 1 is a diagram of the tri-level buffer circuitry and shows an input pad or pin 10 which may be one pin of a complex integrated circuit chip that is reserved for injecting various test signals into the integrated circuit. Pad 10 is electrically connected to the gate element of a p-channel field effect transistor 12 and also to the gate element of an n-channel field effect transistor 14. The n-channel and p-channel field effect transistors will hereinafter be referred to as simply n-transistors and p-transistors.

The drain electrode of p-transistor 12 is connected to the drain of n-transistor 16, the source of which is connected to circuit ground reference. The source of p-transistor 12 is connected to the drain of p-transistor 18, the source of which is connected to a positive voltage conductor 20. The gate of n-transistor 16 is coupled to clock circuitry within the parent integrated circuitry chip that will apply a positive pulse which is referred to as a pre-charge pulse, PC. The gate electrode of the p-transistor 18 is similarly coupled to clock circuitry within the parent chip that will apply, subsequently to the pre-charge pulse and concurrently with an input signal, an inverted pulse referred to as the evaluate pulse, $\overline{E}$. The output from the branch circuit formed by the transistors 12, 16 and 18 is taken from the interconnection of the CMOS transistor pair comprising the p-transistor 12 and the n-transistor 16.

In the second branch circuit, the drain electrode of the n-transistor 14 is connected to the drain electrode of p-transistor 22, the source of which is connected to the positive voltage source conductor 20. The source electrode of n-transistor 14 is coupled to the drain of the n-transistor 24, the source electrode of which is connected to ground reference. The gate electrode of transistor 22 is connected to the internal clock circuitry that will apply the inverted pre-charge pulse, $\overline{PC}$, concurrently with the pre-charge pulse, PC, applied to the transistor 16. Similarly, the gate of the n-transistor 24 is coupled to clock circuitry which will provide, subsequently to the pre-charge pulse, an evaluate pulse, E, concurrently with the pulse applied to p-transistor 18 and the input signal to pad 10. The output from this second branch circuit is taken from the interconnection of the CMOS pair comprising n-transistor 14 and p-transistor 22.

Initialization of the tri-level buffer circuitry by the application of a positive pre-charge pulse, PC, to n-transistor 16 and the inverted pre-charge pulse, $\overline{PC}$, to p-transistor 22 renders those transistors conductive so that the output A is at source potential while output B is at the positive drain potential of conductor 20. The subsequent removal of the pre-charge pulse and the application of the evaluate pulse to the transistors 18 and 24 will render those transistors conductive so that the resulting output levels will depend upon conduction through transistors 12 and 14. If the applied input signal from pin 10 to the gate of p-transistor 12 is high, transistor 12 is off and the output A remains at the source potential established by the previous conduction of transistor 16 during the pre-charge pulse. The high applied input signal on the gate of n-transistor 14 will turn on that transistor to establish conductivity between the output B and the source potential. Therefore, with a high input signal, both outputs A and B are at source potential or logic zero as shown in the truth table of FIG. 3.

If, after removal of the pre-charge pulse and the application of the evaluate pulses to transistors 18 and 24, the applied input signal from pin 10 to transistors 12 and 14 is low n-transistor 14 will remain non-conductive and the output B will remain at the high drain voltage level established by conduction through transistor 22 during the pre-charge pulse. The low level input signal applied to p-transistor 12 will render that transistor conductive to similarly apply a high level output A established by the conduction through transistor 18. Therefore, with a low level input signal, the outputs A and B are both high as indicated by the truth table of FIG. 3.

A third binary output signal is obtained from the tri-level buffer if the input signal applied to the pin 10 will render both the p-transistor 12 and n-transistor 14 conductive. As illustrated in FIG. 2, conduction of n-transistor 14 occurs at a selected positive drain voltage level as indicated by the line 26 and is cut off at the lower threshold level indicated by the line 28. Thus, at any voltage level below that indicated by line 28, n-transistor 14 will become non-conductive. Similarly, p-transistor 12 is rendered conductive by a low input signal such as source potential reference signal indicated by line 30, and will be cut off when the voltage level increases to its threshold level indicated by the line 32. Therefore, the source to drain potential must be selected so that an input signal line between the n-transistor threshold level 28 and the p-transistor threshold level 32 will permit conduction through both types of transistors. With the "half" level input voltage applied to pin 10 of FIG. 1, both transistors 12 and 14 will therefore be conductive. Transistor 14 will then apply conduction between output B, through transistor 24 to source potential reference so that output B will be low. Transistor 12 will complete a path from the output A through transistor 18 to the positive drain voltage conductor 20 so that output A will be high as indicated in the truth table of FIG. 3.

If desired, the source to drain potential may be selected so that a "half" level input signal will render neither p-transistor 12 nor n-transistor 14 conductive. To develop a "1" at output terminal A and a "0" at terminal B with such a potential, a square wave may be applied to pin 10 to alternately turn on the input transistors 12 and 14. Such a square wave must, of course, have a period equal to or less than the duration of the evaluate pulses applied to transistors 18 and 24.

I claim:

1. A dynamic input buffer for generating three binary output signals in response to input signals of differing voltage levels, said buffer comprising:
    first and second branch circuits, said first branch circuit having a p-channel field effect input transistor and said second branch circuit having an n-channel field effect input transistor, said first and second branch circuits being parallel-connected between a first voltage supply terminal having a first voltage level and a second voltage supply terminal having a second more positive voltage level and having an output terminal, and each of said branch circuits having the same input terminal for receiving an input signal at the respective gate electrodes of said input transistors;
    a first switch in said first branch circuit responsive to a first signal for applying said first voltage level to the drain electrode of said first branch input transistor and to said first branch output terminal;
    a first switch in said second branch circuit responsive to a second signal for applying said second voltage level to the drain electrode of said second branch input transistor and to said second branch output terminal;
    a second switch in said first branch circuit responsive to a third signal for applying said second voltage level to the source electrode of said first branch input transistor; and
    a second switch in said second branch circuit and responsive to a fourth signal for applying said first voltage to the source electrode of said second branch circuit input transistor.

2. The dynamic input buffer claimed in claim 1 wherein the voltage difference applied between said first and second voltage supply terminals being such that it renders both of said input transistors conductive upon application of an input signal of substantially half said voltage difference between said supply terminals.

3. The dynamic input buffer claimed in claim 1 wherein the application of a predetermined square wave input signal will alternately render said first and second branch circuit input transistors conductive.

4. The input buffer claimed in claims 2 or 3 wherein said first switch in each of said first and second branch circuits is a field effect transistor that forms a CMOS pair with its associated input transistor, and wherein said output terminal is at the junction of said first switch transistor and its respective input transistor.

5. The input buffer claimed in claim 4 wherein each of said first and second branch circuits comprise said first switch transistors, said input transistors and said second switch in series between said supply terminals.

6. The input buffer claimed in claim 5 wherein said first switch in said first branch circuit is an n-channel transistor, said input transistor is a p-channel transistor, and said second switch is a p-channel field effect transistor, and wherein said first switch in said second branch circuit is a p-channel transistor, said input transistor is an n-channel transistor, and said second switch is an n-channel field effect transistor.

7. A buffer as defined in claim 1 wherein said third and fourth signals are applied subsequently to said first and second signals and concurrently with said input signal.

8. A buffer as defined in claim 1 wherein the geometry of the transistors is such that the threshold to cutoff voltage ranges of said input transistors have an overlapping region.

9. A buffer as defined in claim 8 wherein both said input transistors conduct when an input voltage lying anywhere in the overlapping region of the threshold to cutoff voltage ranges for said input transistors is applied to the common input terminal.

10. An input buffer for generating three distinct binary codes on first and second outputs in response to three different voltage levels for an input signal at an input node at a single input comprising:
    first means for establishing first voltage levels at said outputs in response to a first signal; and
    second switching means coupled to said input signal and said two outputs and having two input transistors of opposite channel conductivities, each having its gate electrode coupled to said input node and having geometries such that the threshold voltage to cutoff voltage range of each transistor partially overlaps that of the other, said second means for generating one of said three distinct binary codes for each said input voltage level one of which input voltage levels lies in said overlapping region.

11. A method of converting three distinct voltages at a single input into one of three binary combinations at first and second outputs comprising the steps of:
    (1) connecting the first output to a first voltage reference source and connecting said second output to a second voltage reference source at a first time to establish a first binary state for said first and second outputs;

(2) sensing the voltage level of an input signal;
(3) connecting or blocking at a second time an electrical path from said first output to said second voltage reference source depending upon the voltage level of said input signal; and
(4) connecting or blocking at a third time an electrical path from said second output to said first voltage reference source depending upon the voltage level of said input signal.

12. A method as defined in claim 11 wherein a connection in step 3 and a block in step 4 are made when said input signal is at a first predetermined level and the reverse situation occurs when said input signal is at a second predetermined level.

13. A method as defined in claim 12 wherein a connection is made in both steps 3 and 4 when the input signal has a predetermined voltage between said first and second predetermined levels.

* * * * *